United States Patent
Tachibana

(10) Patent No.: US 11,503,709 B2
(45) Date of Patent: Nov. 15, 2022

(54) PRINTED WIRING BOARD AND METHOD FOR MANUFACTURING PRINTED WIRING BOARD

(71) Applicant: IBIDEN CO., LTD., Gifu (JP)

(72) Inventor: Shota Tachibana, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/161,737

(22) Filed: Jan. 29, 2021

(65) Prior Publication Data
US 2021/0259106 A1 Aug. 19, 2021

(30) Foreign Application Priority Data
Feb. 18, 2020 (JP) .............................. JP2020-025489

(51) Int. Cl.
*H05K 1/11* (2006.01)
*H05K 1/09* (2006.01)
(Continued)

(52) U.S. Cl.
CPC .............. *H05K 1/113* (2013.01); *H05K 1/09* (2013.01); *H05K 3/0041* (2013.01); *H05K 3/244* (2013.01);
(Continued)

(58) Field of Classification Search
CPC ... H05K 2201/0209; H05K 2201/0212; H05K 2201/0332; H05K 2201/0335;
(Continued)

(56) References Cited

U.S. PATENT DOCUMENTS 8,686,300 B2 * 4/2014 Kawai ................... H05K 1/112
174/262
9,282,640 B2 * 3/2016 Kwon ...................... H05K 1/11
(Continued)

FOREIGN PATENT DOCUMENTS

JP 2015-115335 A 6/2015
WO WO-2020027022 A1 * 2/2020 ............. H05K 1/034

OTHER PUBLICATIONS

WO-2020027022-A1 (Translation) (Year: 2022).*

*Primary Examiner* — Timothy J Thompson
*Assistant Examiner* — John B Freal
(74) *Attorney, Agent, or Firm* — Oblon, McClelland, Maier & Neustadt, L.L.P.

(57) ABSTRACT

A printed wiring board includes resin insulating layers including an outermost resin insulating layer, conductor layers laminated on the resin insulating layers, a copper layer formed in the outermost insulating layer, and metal bumps formed on the copper layer such that the bumps have upper surfaces protruding from the outermost insulating layer and that each metal bump includes Ni film, Pd film and Au film. The copper layer is reduced in diameter toward upper surface side such that the copper layer has upper and bottom surfaces and each upper surface has diameter that is smaller than diameter of each bottom surface, the outermost insulating layer has cylindrical sidewalls formed such that at least part of the copper layer is not in contact with the sidewalls, and the bumps are formed such that the Ni film is filling spaces between the copper layer and the sidewalls of the outermost insulating layer.

20 Claims, 4 Drawing Sheets

(51) Int. Cl.
*H05K 3/46* (2006.01)
*H05K 3/24* (2006.01)
*H05K 3/00* (2006.01)

(52) U.S. Cl.
CPC ... *H05K 3/4682* (2013.01); *H05K 2201/0347* (2013.01); *H05K 2201/09827* (2013.01)

(58) Field of Classification Search
CPC ... H05K 2201/0338; H05K 2201/0341; H05K 2201/0347; H05K 2201/0352; H05K 2201/0379; H05K 2201/09454; H05K 2201/09481; H05K 2201/09754; H05K 2201/09763; H05K 2201/098; H05K 2201/09827; H05K 2201/099; H05K 1/11; H05K 1/111; H05K 1/18; H05K 1/181; H05K 1/182; H05K 1/0306; H05K 1/09
See application file for complete search history.

(56) References Cited

U.S. PATENT DOCUMENTS

| | | | |
|---|---|---|---|
| 9,613,893 B2* | 4/2017 | Terui | C23C 18/1651 |
| 2009/0188706 A1* | 7/2009 | Endo | H05K 3/4007 |
| | | | 216/13 |
| 2010/0263923 A1* | 10/2010 | Kodani | H01L 23/49811 |
| | | | 29/846 |
| 2010/0308451 A1* | 12/2010 | Kodani | H05K 1/09 |
| | | | 257/E23.068 |
| 2012/0067635 A1* | 3/2012 | Nang | B23K 3/0623 |
| | | | 228/203 |
| 2012/0222894 A1* | 9/2012 | Kaneko | H05K 3/244 |
| | | | 216/13 |
| 2020/0367369 A1* | 11/2020 | Awazu | H05K 3/4632 |

* cited by examiner

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2020-025489, filed Feb. 18, 2020, the entire contents of which are incorporated herein by reference.

BACKGROUND OF THE INVENTION

Field of the Invention

The present invention relates to a printed wiring board having metal bumps.

Description of Background Art

Japanese Patent Application Laid-Open Publication No. 2015-115335 describes a method for manufacturing a printed wiring board in which a conductor layer and a resin insulating layer are laminated on a support plate and which does not have a core substrate that separates the support plate. In Japanese Patent Application Laid-Open Publication No. 2015-115335, it is thought that pads are formed of a single metal on the support plate. The entire contents of this publication are incorporated herein by reference.

SUMMARY OF THE INVENTION

According to one aspect of the present invention, a printed wiring board includes resin insulating layers including an outermost resin insulating layer, conductor layers laminated on the resin insulating layers, respectively, a copper layer formed in the outermost resin insulating layer of the resin insulating layers, and metal bumps formed on the copper layer such that the metal bumps have upper surfaces protruding from the outermost resin insulating layer and that each of the metal bumps includes a Ni film, a Pd film and an Au film. The copper layer is reduced in diameter toward an upper surface side thereof such that the copper layer has upper surfaces and bottom surfaces and that each of the upper surfaces has a diameter that is smaller than a diameter of each of the bottom surfaces, the outermost resin insulating layer has cylindrical sidewalls formed such that at least part of the copper layer is not in contact with the cylindrical sidewalls, and the metal bumps are formed such that the Ni film is filling spaces between the copper layer and the cylindrical sidewalls of the outermost resin insulating layer.

According to another aspect of the present invention, a method for manufacturing a printed wiring board includes preparing a support plate having a copper foil, forming a metal layer including a copper film, a Ni film and a copper layer on the copper foil of the support plate, forming a build-up layer including resin insulating layers and conductor layer on the copper foil, separating a structure including the copper foil, the metal layer of the copper film, Ni film and copper layer, and the build-up layer from the support plate, etching the copper foil of the support plate and the copper film of the metal layer such that the copper foil of the support plate and the copper film of the metal layer are removed from the build-up layer, applying plasma etching to partially remove the outermost resin insulating layer such that the Ni film and an upper surface side of the copper layer are exposed, applying selective etching to remove the Ni film of the metal layer and soft etching to remove a portion of the copper layer such that cylindrical sidewalls are formed in the outermost resin insulating layer, and forming metal bumps including a Ni film, a Pd film and an Au film on the copper layer such that the Ni film fills spaces between the copper layer and the cylindrical sidewalls of the outermost resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
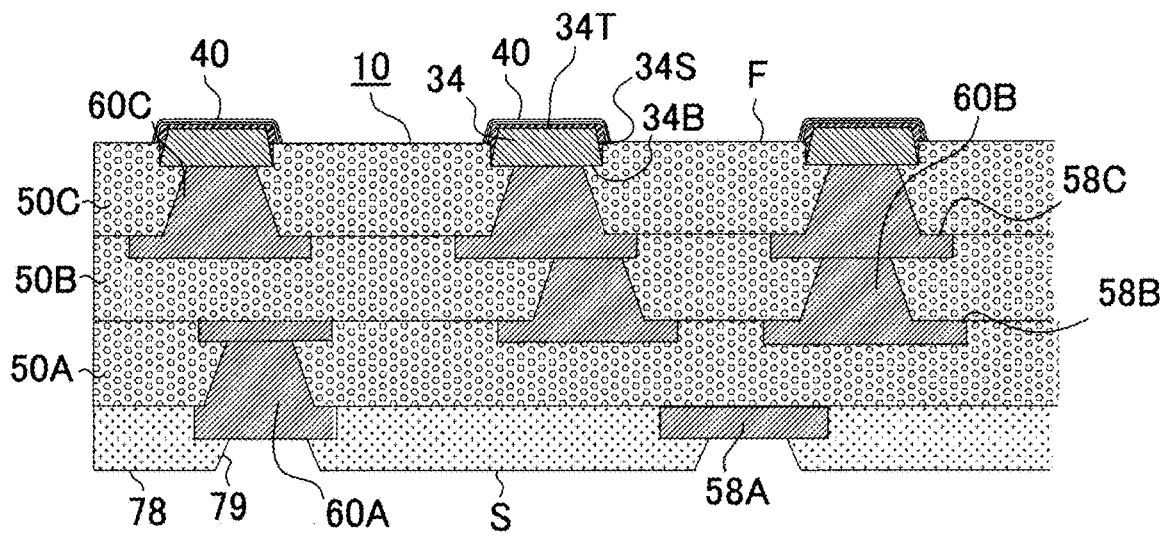
FIG. 1A is a cross-sectional view of a printed wiring board according to an embodiment of the present invention.

Embodiments will now be described with reference to the accompanying drawings, wherein like reference numerals designate corresponding or identical elements throughout the various drawings.

FIG. 1A illustrates a printed wiring board 10 according to an embodiment of the present invention.

The printed wiring board 10 has a first surface (F) and a second surface (S) on an opposite side with respect to the first surface, and includes three resin insulating layers including an outermost resin insulating layer (50C), a second resin insulating layer (50B) and a first resin insulating layer (50A). The outermost resin insulating layer (50C), the second resin insulating layer (50B) and the first resin insulating layer (50A) are formed by buildup-laminating resin films. A first conductor layer (58A) forming pads is formed on the second surface (S) side of the first resin insulating layer (50A). A solder resist layer 78 having openings 79 is provided on the first resin insulating layer (50A) and the first conductor layer (58A). A second conductor layer (58B) is formed on the second surface (S) side of the second resin insulating layer (50B). The first conductor layer (58A) and the second conductor layer (58B) are connected to each other via via conductors (60A) penetrating the first resin insulating layer (50A). A third conductor layer (58C) is formed on the second surface (S) side of the outermost resin insulating layer (50C). The second conductor layer (58B) and the third conductor layer (58C) are connected to each other via via conductors (60B) penetrating the second resin insulating layer (50B). An outermost conductor layer 34 is formed on the first surface (F) side of the outermost resin insulating layer (50C). The third conductor layer (58C) and the outermost conductor layer 34 are connected to each other via via conductors (60C) penetrating the outermost resin insulating layer (50C).

Figure 1B:
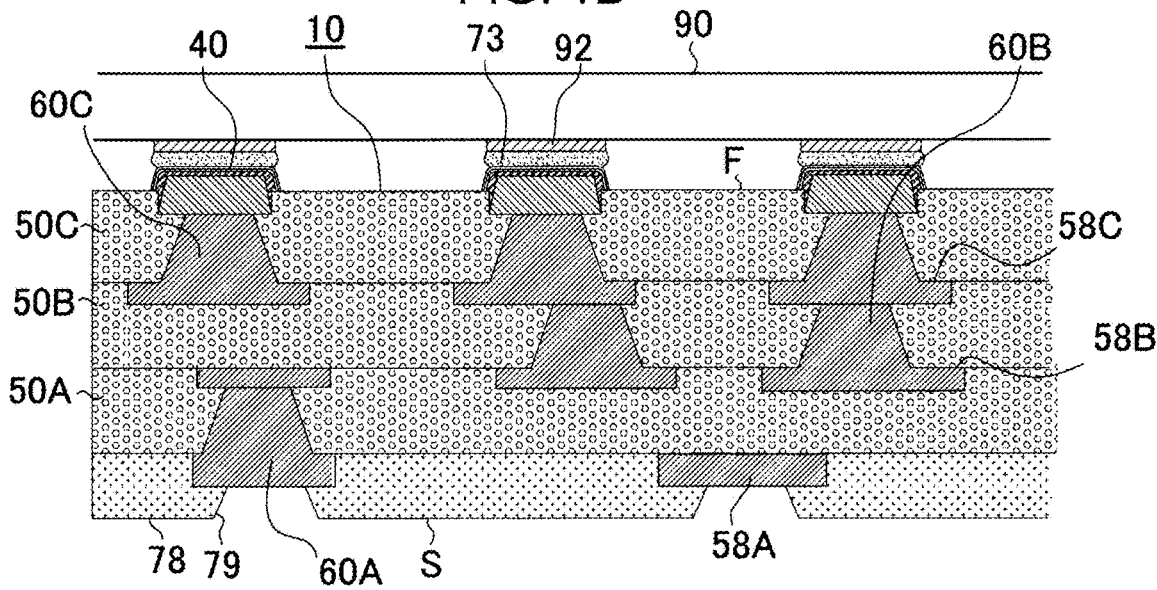
FIG. 1B is a cross-sectional view of an application example of the printed wiring board according to the embodiment.
Figure 1C:
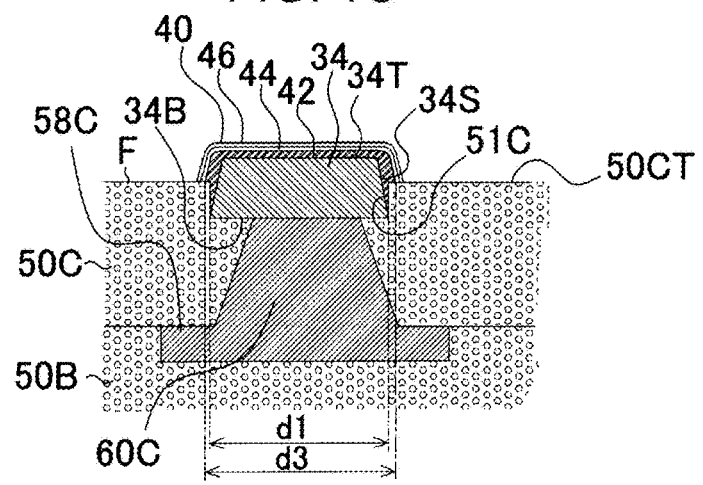
FIG. 1C is an enlarged cross-sectional view of a metal bump of the embodiment.

FIG. 1C is an enlarged cross-sectional view of one of metal bumps 40.

In the uppermost conductor layer 34, a portion (upper half) of a side surface (34S) and an upper surface (34T) protrude from the outermost resin insulating layer (50C), and a portion (lower half) of the side surface (34S) and a bottom surface (34B) remain inside the outermost resin insulating layer (50C). The metal bumps 40 are each formed by providing a Ni film 42, a Pd film 44, and an Au film 46 on the uppermost conductor layer (copper layer) 34.

Figure 4A:
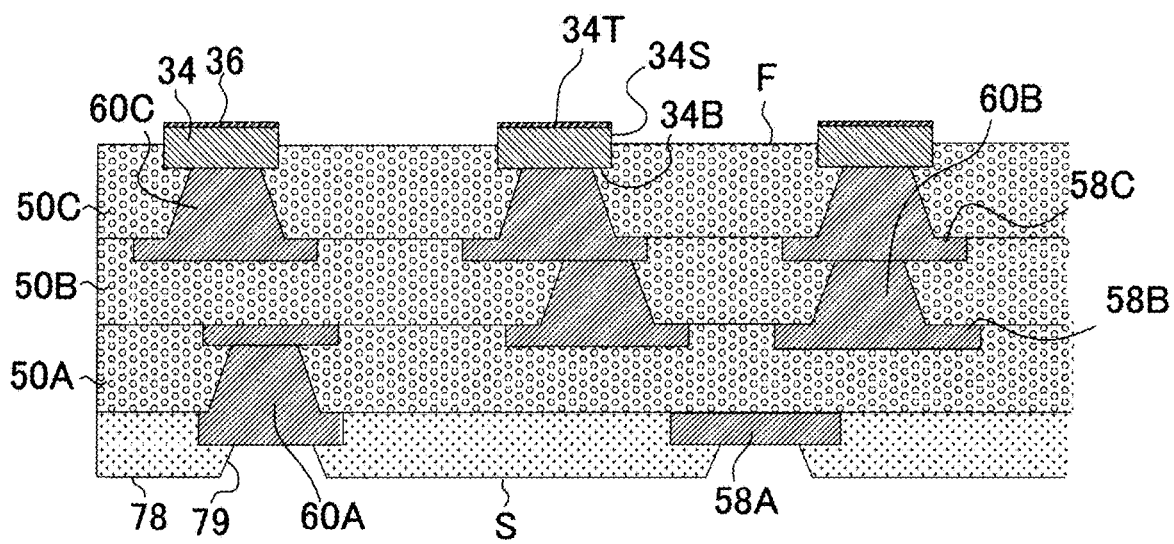
FIGS. 4A and 4B are manufacturing process diagrams of a printed wiring board according to the embodiment.
Figure 4B:
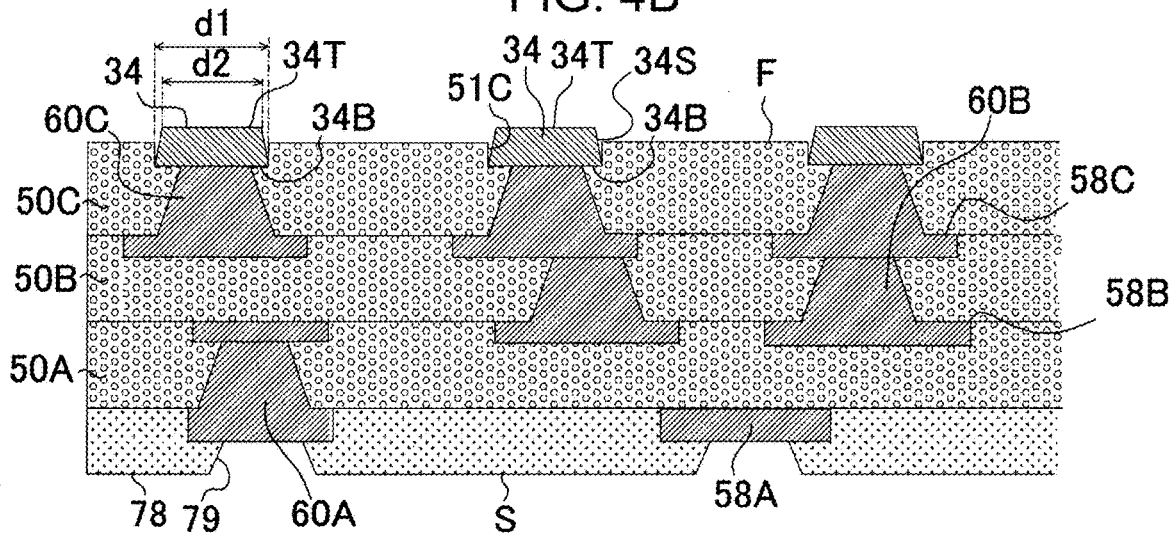
Figure 4C:
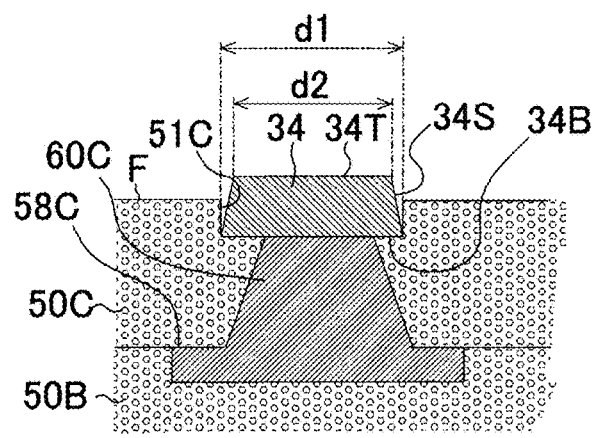
FIG. 4C is an enlarged cross-sectional view of an uppermost conductor layer (copper layer) according to an embodiment of the present invention.

FIG. 4C is an enlarged cross-sectional view of the uppermost conductor layer (copper layer) 34 before the formation of the Ni film, the Pd film and the Au film.

Around the uppermost conductor layer (copper layer) 34, a cylindrical sidewall (51C) of the outermost resin insulating layer (50C) is formed. The sidewall (51C) is formed by being in contact with a sidewall of the copper layer before an etching process. The copper layer 34 is reduced in diameter toward the upper surface (34T) side such that a diameter (d2) of the upper surface (34T) is smaller than a diameter (d1) of the bottom surface (34B). A portion of or the entire side surface (34S) of the copper layer 34 is not in contact with the cylindrical sidewall (51C) of the outermost resin insulating layer (50C) around the side surface.

As illustrated in FIG. 1C, the Ni film 42 fills between the side surface (34S) of the copper layer 34 and the cylindrical sidewall (51C) of the outermost resin insulating layer (50C). Since the copper layer 34 tightly adheres to the outermost resin insulating layer (50C) via the Ni film 42, connection reliability of the metal bumps 40 can be increased. The Ni film 42 extends laterally to an upper surface (50CT) of the outermost resin insulating layer (50C) on an outer side of the sidewall (51C). An outer diameter (maximum diameter) (d3) of the Ni film 42 is larger than the diameter (d1) of the bottom surface (34B) of the copper layer 34. The bottom surface (34B) of the copper layer 34 and the side surface (34S) that is in contact with the outermost resin insulating layer (50C) are larger in roughness than the upper surface (34T) and the side surface (34S) that is not in contact with the outermost resin insulating layer (50C). The diameter (d1) of the bottom surface (34B) of the copper layer 34 forming the metal bump is 50 μm or less. A pitch of the metal bumps 40 is 90 μm or less, and a spacing between the metal bumps is 50 μm or less.

FIG. 1B illustrates an application example in which an electronic component 90 is mounted on the printed wiring board 10 of the embodiment.

The electronic component 90 is mounted on the printed wiring board 10 by connecting pads 92 of the electronic component 90 via a metal layer 73 on the metal bumps 40.

The resin insulating layers (50A, 50B, 50C) are each formed of a resin that does not contain a core material but contains about 50 w % of an inorganic filler. The solder resist layer 78 is formed of a resin that does not contain inorganic fibers but contains about 20 w % of an inorganic filler.

Manufacturing Method

FIGS. 2A-4C illustrate a method for manufacturing a printed wiring board according to an embodiment of the present invention.

Figure 2A:
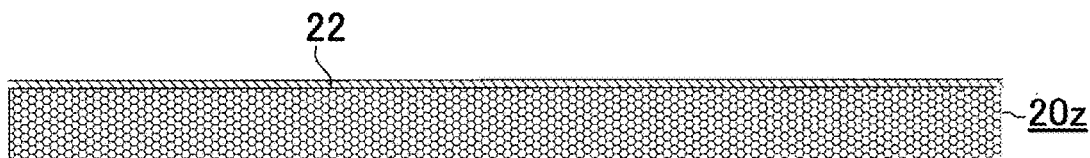
FIGS. 2A-2E are manufacturing process diagrams of a printed wiring board according to an embodiment of the present invention.
Figure 2B:
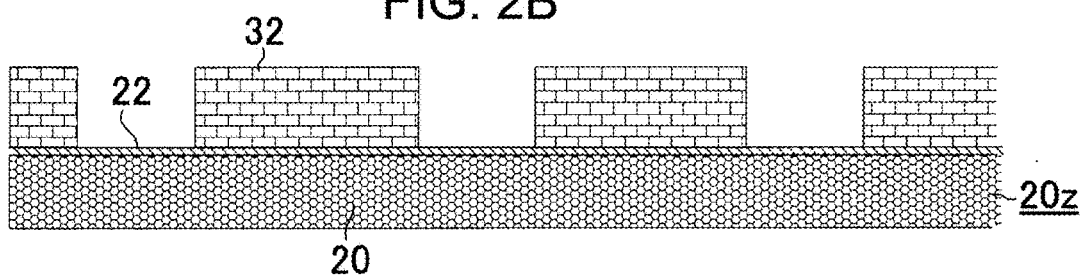
Figure 2C:
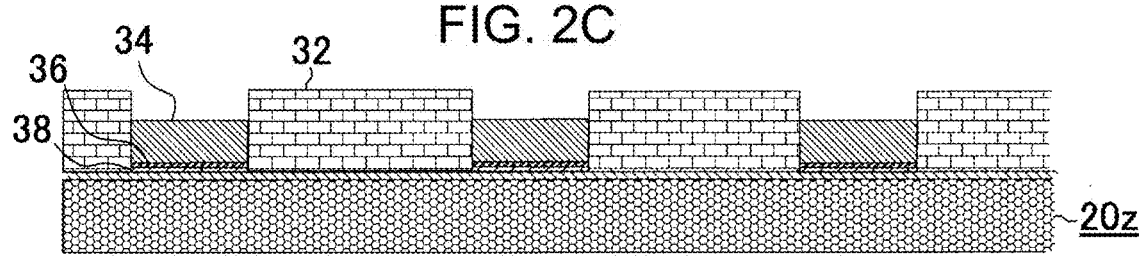
Figure 2D:
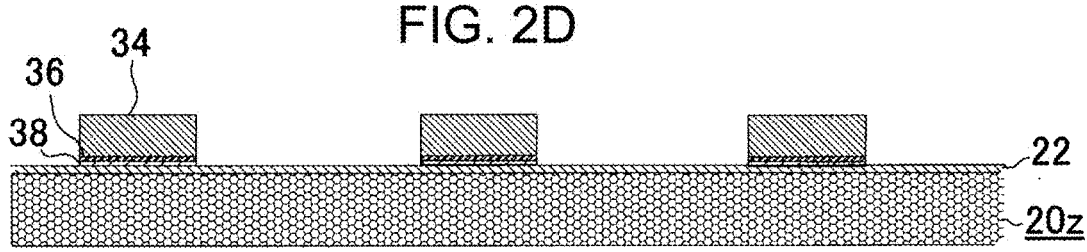
Figure 2E:
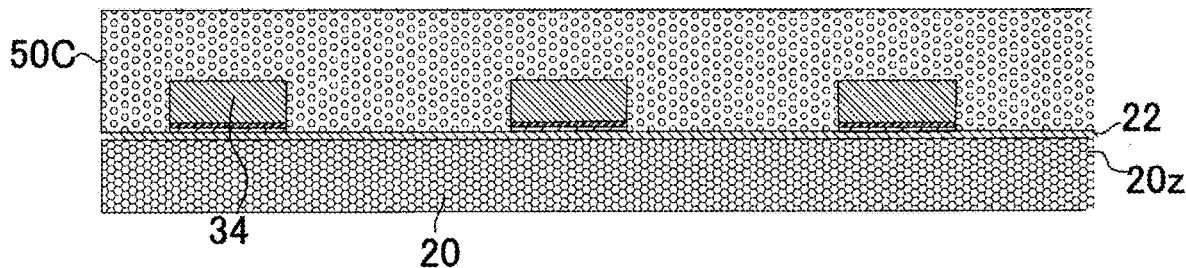
Figure 3A:
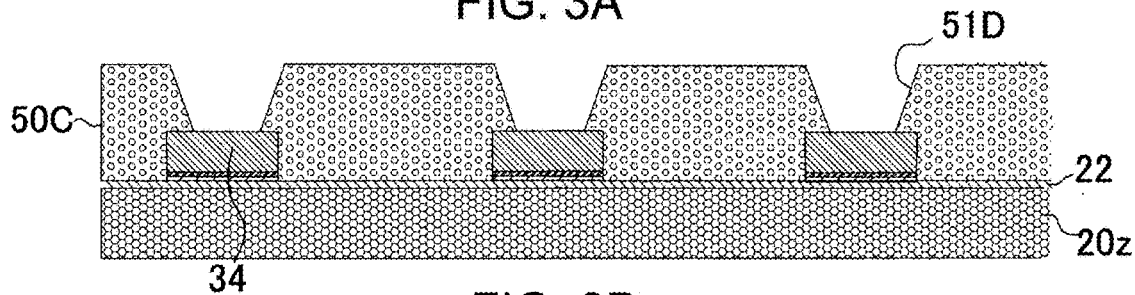
FIGS. 3A-3D are manufacturing process diagrams of a printed wiring board of the embodiment.
Figure 3B:
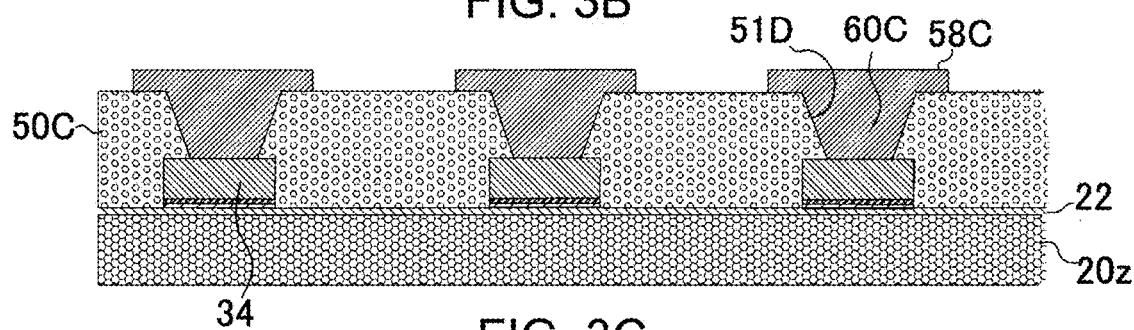
Figure 3C:
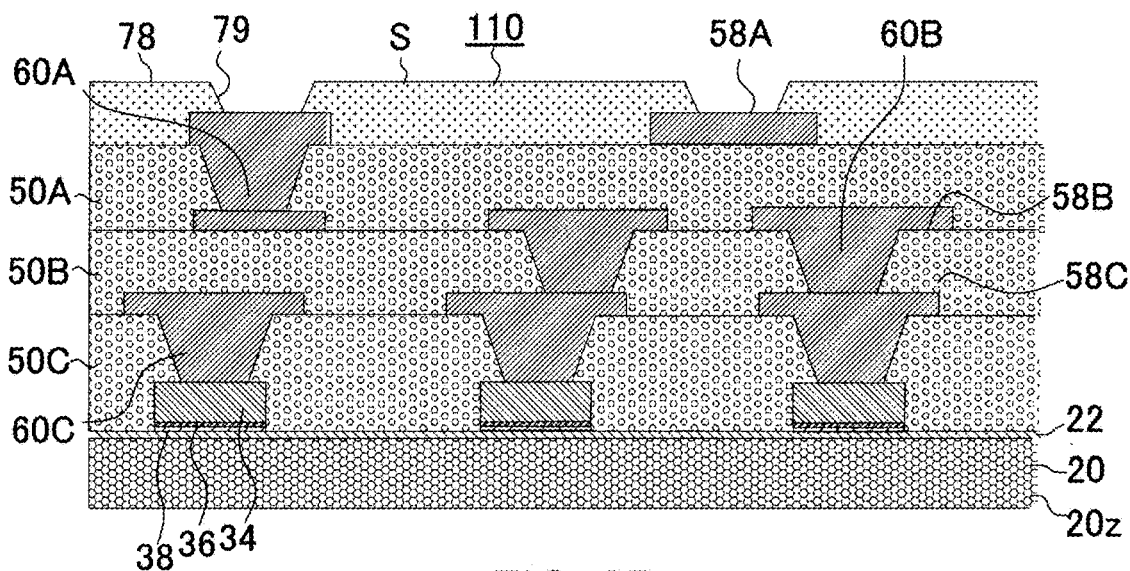

A support plate (20z) in which a copper foil 22 is laminated on a support substrate 20 is prepared (FIG. 2A). A plating resist 32 is formed on the copper foil 22 of the support plate (20z) (FIG. 2B). On the copper foil 22 exposed from the plating resist 32, a relatively thin copper film 38, a Ni film 36, and a relatively thick copper layer 34 are formed by electrolytic plating (FIG. 2C). The plating resist is peeled off, and side surfaces of the copper film 38, the Ni film 36 and the copper layer 34 are exposed (FIG. 2D). The outermost resin insulating layer (50C) is laminated on the copper foil 22 and the copper layer (outermost conductor layer) 34 (FIG. 2E). Openings (51D) reaching the outermost conductor layer 34 are formed in the outermost resin insulating layer (50C) (FIG. 3A). By electroless plating and electroplating, the via conductors (60C) are formed in the openings (51D), and the third conductor layer (58C) is formed on the outermost resin insulating layer (50C) (FIG. 3B). The processes of FIGS. 2E-3B are repeated, and the second resin insulating layer (50B), the via conductors (60B) and the conductor layer (58B) are formed, the first resin insulating layer (50A), the via conductors (60A) and the first conductor layer (58A) are formed, the solder resist layer 78 is formed on the first resin insulating layer (50A) and the first conductor layer (58A), and an intermediate 110 is completed (FIG. 3C).

Figure 3D:
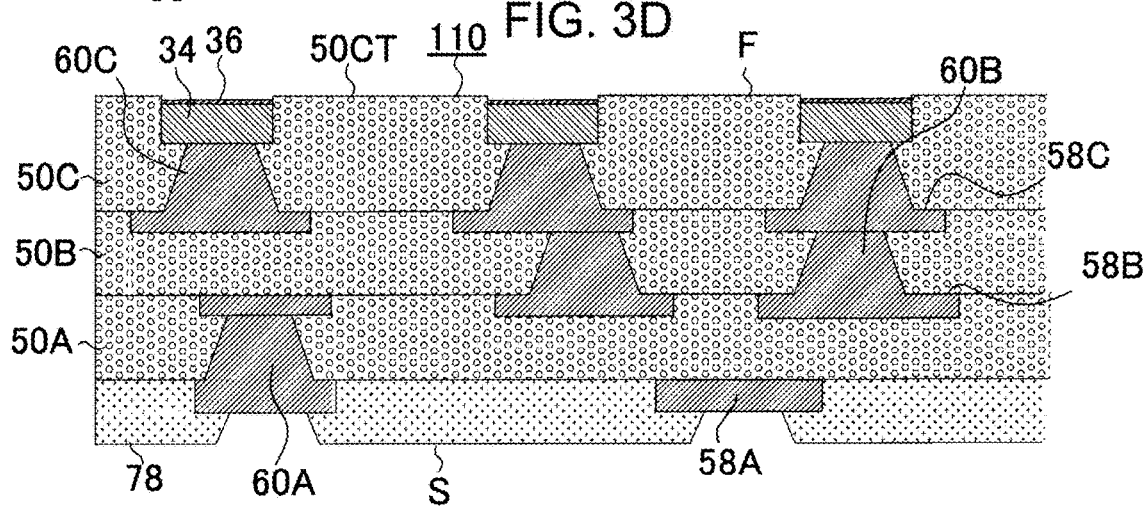

The support substrate 20 is separated from the intermediate 110, and the copper foil 22 and the copper film 38 are removed (FIG. 3D). When the copper foil is removed by etching, the outermost copper film 38 is also etched. Therefore, the Ni film 36 is recessed relative to the upper surface (50CT) of the outermost resin insulating layer (50C). By plasma etching of a CF4+O2 plasma gas, the surface of the outermost resin insulating layer (50C) is removed by 3-8 μm, and the Ni film 36 and the upper surface (34T) side of the copper layer 34 are exposed from the outermost resin insulating layer (50C) (FIG. 4A). The inorganic filler exposed from the outermost resin insulating layer (50C) by the plasma etching is removed by wet blasting. As a result, when an underfill material is filled on the outermost resin insulating layer (50C), adhesion with the underfill material is increased.

The Ni film 36 is removed by etching. A portion of the copper layer is also etched when the Ni film is removed. Further, the surface of the copper layer is etched by soft etching. As illustrated in FIG. 4C, the side surface (34S) of the copper layer 34 is inclined (FIG. 4B). Around the uppermost conductor layer (copper layer) 34, the cylindrical sidewall (51C) of the outermost resin insulating layer (50C) is formed. The sidewall (51C) is formed by being in contact with the sidewall of the copper layer before the etching process. The copper layer 34 is reduced in diameter toward the upper surface (34T) side such that the diameter (d2) of the upper surface (34T) is smaller than the diameter (d1) of the bottom surface (34B). The unetched bottom surface (34B) of the copper layer 34 and the unetched side surface (34S) that is in contact with the outermost resin insulating layer (50C) are larger in roughness than the etched upper surface (34T) and the etched side surface (34S) that is not in contact with the outermost resin insulating layer (50C). A portion of or the entire side surface (34S) of the copper layer 34 is not in contact with the cylindrical sidewall (51C) of the outermost resin insulating layer (50C) around the side surface.

As illustrated in FIGS. 1A and 1C, the Ni film 42, the Pd film 44 and the Au film 46 are provided on the copper layer 34 to form the metal bumps 40, and the printed wiring board 10 is completed. The Ni film 42 fills between the side surface (34S) of the copper layer 34 and the cylindrical sidewall (51C) of the outermost resin insulating layer (50C). Since the copper layer 34 tightly adheres to the outermost resin insulating layer (50C) via the Ni film 42, connection reliability of the metal bumps 40 can be increased.

The electronic component 90 is mounted on the printed wiring board 10 by connecting the pads 92 of the electronic component 90 via the metal layer 73 on the metal bumps 40 (FIG. 1B).

According to the method for manufacturing a printed wiring board according to the embodiment, the metal bumps 40 are formed to each include the copper film 38, the Ni film 36 and the copper layer 34 formed on the copper foil 22. Then, by completely removing, by etching, the copper film 38 and the Ni film 36 and keeping the copper layer 34, the metal bumps are formed. Since the Ni film is completely removed by etching and the copper layer 34 is kept, the copper layer 34 does not vary in height, and the metal bumps 40 can have uniform heights even when being formed with small diameters. The connection reliability of the metal bumps 40 can be increased.

In Japanese Patent Application Laid-Open Publication No. 2015-115335, the pads are formed of a single metal, and when metal bumps are formed by exposing the pads, it is thought that it is difficult for the metal bumps to have uniform heights.

A printed wiring board according to an embodiment of the present invention is formed by alternately laminating conductor layers and resin insulating layers. In the printed wiring board, upper surfaces of metal bumps of an outermost resin insulating layer protrude from outermost resin insulating layer; the metal bumps are each formed by forming a Ni film, a Pd film and an Au film on a copper layer; the copper layer is reduced in diameter toward an upper surface side thereof such that a diameter of an upper surface thereof is smaller than a diameter of a bottom surface thereof; a portion or entire side surface of the copper layer is not in contact with a cylindrical sidewall of the outermost resin insulating layer around the side surface; and the Ni film fills between the side surface of the copper layer and the cylindrical sidewall of the outermost resin insulating layer.

A method for manufacturing a printed wiring board according to another embodiment of the present invention has metal bumps and includes alternately laminating conductor layers and resin insulating layers. The method includes: preparing a support plate having a copper foil; forming a copper film, a Ni film and a copper layer on the copper foil; forming a build-up layer including a resin insulating layer and a conductor layer on the copper foil; separating the copper foil and the build-up layer from the support plate; removing the copper foil and the copper film by etching; exposing the Ni film and an upper surface side of the copper layer by partially removing the outermost resin insulating layer by plasma etching; exposing a cylindrical sidewall of the outermost resin insulating layer by removing the Ni film by selective etching and then removing a portion of the copper layer by soft etching, the cylindrical sidewall being formed by being in contact with a side surface of the copper layer before an etching process; and forming the metal bumps by forming a Ni film, a Pd film and an Au film on the copper layer. The Ni film fills between the side surface of the copper layer and the cylindrical sidewall of the outermost resin insulating layer.

In a printed wiring board according to an embodiment of the present invention, the Ni film forming the metal bumps fills between the side surface of the copper layer and the cylindrical sidewall of the outermost resin insulating layer. Since the copper layer tightly adheres to the outermost resin insulating layer via the Ni film, connection reliability of the metal bumps can be increased.

According to a method for manufacturing a printed wiring board according to an embodiment of the present invention, the metal bumps are formed to each include the copper film, the Ni film and the copper layer formed on copper foil. Then, by completely removing, by etching, the copper film and the Ni film and keeping the copper layer, the metal bumps are formed. Since the Ni film is completely removed by etching and the copper layer is kept, the copper layer does not vary in height, and the metal bumps can have uniform heights even when being formed with small diameters. The connection reliability of the metal bumps can be increased.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a plurality of resin insulating layers including an outermost resin insulating layer;
   a plurality of conductor layers laminated on the plurality of resin insulating layers, respectively;
   a copper layer formed in the outermost resin insulating layer of the plurality of resin insulating layers;
   a plurality of via conductors formed in a plurality of openings in the outermost resin insulating layer respectively such that the plurality of via conductors is formed in the outermost resin insulating layer and connected to the copper layer; and
   a plurality of metal bumps formed on the copper layer such that the metal bumps have upper surfaces protruding from the outermost resin insulating layer and that each of the metal bumps includes a Ni film, a Pd film and an Au film,
   wherein the copper layer is reduced in diameter toward an upper surface side thereof such that the copper layer has a plurality of upper surfaces and a plurality of bottom surfaces and that each of the upper surfaces has a diameter that is smaller than a diameter of each of the bottom surfaces, the outermost resin insulating layer has a plurality of cylindrical sidewalls formed such that at least part of the copper layer is not in contact with the cylindrical sidewalls, and the plurality of metal bumps is formed such that the Ni film is filling spaces between the copper layer and the cylindrical sidewalls of the outermost resin insulating layer.

2. The printed wiring board according to claim 1, wherein the copper layer has part of a plurality of side surfaces that is in contact with the outermost resin insulating layer such that the bottom surfaces and the part of the side surfaces have roughness that is larger than roughness of the upper surfaces and part of the side surfaces that is not in contact with the outermost resin insulating layer.

3. The printed wiring board according to claim 1, wherein the plurality of metal bumps is formed such that each of the metal bumps has a bottom surface having a diameter of 50 μm or less and that the plurality of metal bumps has a pitch of 90 μm or less and a spacing of 50 μm or less between the metal bumps.

4. The printed wiring board according to claim 1, wherein the plurality of metal bumps is formed such that an outer diameter of the Ni film is larger than the diameter of each of the bottom surfaces of the copper layer.

5. The printed wiring board according to claim 2, wherein the plurality of metal bumps is formed such that each of the metal bumps has a bottom surface having a diameter of 50

µm or less and that the plurality of metal bumps has a pitch of 90 µm or less and a spacing of 50 µm or less between the metal bumps.

6. The printed wiring board according to claim 2, wherein the plurality of metal bumps is formed such that an outer diameter of the Ni film is larger than the diameter of each of the bottom surfaces of the copper layer.

7. The printed wiring board according to claim 3, wherein the plurality of metal bumps is formed such that an outer diameter of the Ni film is larger than the diameter of each of the bottom surfaces of the copper layer.

8. The printed wiring board according to claim 5, wherein the plurality of metal bumps is formed such that an outer diameter of the Ni film is larger than the diameter of each of the bottom surfaces of the copper layer.

9. The printed wiring board according to claim 1, wherein the plurality of resin insulating layers is formed such that the outermost resin insulating layer includes inorganic filler.

10. The printed wiring board according to claim 1, wherein the plurality of metal bumps is formed such that each of the metal bumps has a bottom surface having a diameter of 50 µm or less.

11. The printed wiring board according to claim 10, wherein the copper layer has part of a plurality of side surfaces that is in contact with the outermost resin insulating layer such that the bottom surfaces and the part of the side surfaces have roughness that is larger than roughness of the upper surfaces and part of the side surfaces that is not in contact with the outermost resin insulating layer.

12. The printed wiring board according to claim 10, wherein the plurality of metal bumps is formed such that an outer diameter of the Ni film is larger than the diameter of each of the bottom surfaces of the copper layer.

13. The printed wiring board according to claim 1, wherein the plurality of metal bumps is formed such that the plurality of metal bumps has a pitch of 90 µm or less and a spacing of 50 µm or less between the metal bumps.

14. The printed wiring board according to claim 13, wherein the copper layer has part of a plurality of side surfaces that is in contact with the outermost resin insulating layer such that the bottom surfaces and the part of the side surfaces have roughness that is larger than roughness of the upper surfaces and part of the side surfaces that is not in contact with the outermost resin insulating layer.

15. The printed wiring board according to claim 13, wherein the plurality of metal bumps is formed such that an outer diameter of the Ni film is larger than the diameter of each of the bottom surfaces of the copper layer.

16. The printed wiring board according to claim 1, wherein the outermost resin insulating layer has the plurality of cylindrical sidewalls formed such that the copper layer is not in contact with the cylindrical sidewalls.

17. A method for manufacturing a printed wiring board, comprising:

preparing a support plate having a copper foil;

forming a metal layer comprising a copper film, a Ni film and a copper layer on the copper foil of the support plate;

forming a build-up layer comprising a plurality of resin insulating layers and a plurality of conductor layers on the copper foil;

separating a structure comprising the copper foil, the metal layer of the copper film, Ni film and copper layer, and the build-up layer from the support plate;

etching the copper foil of the support plate and the copper film of the metal layer such that the copper foil of the support plate and the copper film of the metal layer are removed from the build-up layer;

applying plasma etching to partially remove the outermost resin insulating layer such that the Ni film and an upper surface side of the copper layer are exposed;

applying selective etching to remove the Ni film of the metal layer and soft etching to remove a portion of the copper layer such that a plurality of cylindrical sidewalls is formed in the outermost resin insulating layer; and forming a plurality of metal bumps comprising a Ni film, a Pd film and an Au film on the copper layer such that the Ni film fills spaces between the copper layer and the cylindrical sidewalls of the outermost resin insulating layer, wherein the forming of the build-up layer includes forming a plurality of openings in the outermost resin insulating layer and forming a plurality of via conductors in the plurality of openings in the outermost resin insulating layer respectively such that the plurality of via conductors is formed in the outermost resin insulating layer and connected to the copper layer.

18. The method for manufacturing a printed wiring board according to claim 17, further comprising:

applying, after the outermost resin insulating layer is partially removed by the plasma etching, wet blasting on a surface of the outermost resin insulating layer such that inorganic filler of the outermost resin insulating layer is removed from the surface of the outermost resin insulating layer.

19. The method for manufacturing a printed wiring board according to claim 17, wherein the metal layer comprising the copper film, the Ni film and the copper layer on the copper foil is formed on non-forming part of a plating resist formed on the copper foil of the support plate.

20. The method for manufacturing a printed wiring board according to claim 18, wherein the metal layer comprising the copper film, the Ni film and the copper layer on the copper foil is formed on non-forming part of a plating resist formed on the copper foil of the support plate.

\* \* \* \* \*